(12) United States Patent
Dieterich et al.

(10) Patent No.: US 11,116,093 B2
(45) Date of Patent: Sep. 7, 2021

(54) WING HINGE FOR A FIELD DEVICE HOUSING AND FIELD DEVICE HOUSING WITH WING HINGE

(71) Applicant: Endress+Hauser Conducta GmbH+Co. KG, Gerlingen (DE)

(72) Inventors: Michael Dieterich, Waiblingen (DE); Thomas Baumgartner, Stuttgart (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 0 days.

(21) Appl. No.: 16/717,478

(22) Filed: Dec. 17, 2019

(65) Prior Publication Data

US 2020/0196469 A1 Jun. 18, 2020

(30) Foreign Application Priority Data

Dec. 18, 2018 (DE) ...................... 10 2018 132 674.2

(51) Int. Cl.
*H05K 5/02* (2006.01)
*E05D 3/06* (2006.01)
(Continued)

(52) U.S. Cl.
CPC ............. *H05K 5/0226* (2013.01); *E05D 3/06* (2013.01); *E05D 7/08* (2013.01); *E05D 11/0081* (2013.01);
(Continued)

(58) Field of Classification Search
CPC ......... E05D 3/06; E05D 11/0081; E05D 7/08; E05Y 2201/484; E05Y 2900/606; H05K 5/0226; H02B 1/38; Y10T 16/546; Y10T 16/5474; Y10T 16/547; Y10T 16/5355; Y10T 16/527
See application file for complete search history.

(56) References Cited

U.S. PATENT DOCUMENTS

| 426,597 | A | * | 4/1890 | Libbey | ...................... E05D 1/00 16/277 |
| 3,268,158 | A | * | 8/1966 | Abbott | ...................... E05G 1/04 232/1 R |

(Continued)

FOREIGN PATENT DOCUMENTS

| DE | 2934700 A1 | 3/1980 |
| DE | 102004006863 A1 | 9/2005 |
| DE | 102012102517 A1 | 9/2013 |

*Primary Examiner* — Hanh V Tran
(74) *Attorney, Agent, or Firm* — Christopher R. Powers; Endress+Hauser (USA) Holding Inc.

(57) ABSTRACT

The present disclosure relates to a wing hinge for a field device housing, including: a first wing having a first and a second holding device, the first holding device configured to connect to the field device housing and to move the first wing about a first axis; a second wing having a third and a fourth holding device, the third holding device configured to connect to the second holding device and to move the second wing relative to the first wing about a second axis, wherein the fourth holding device is connectable to a housing cover as to move the housing cover relative to the second wing about a third axis; and a tensioning element in contact with the first wing and the second wing and configured to move the first wing relative to the second wing about the second axis from a first position into a second position.

7 Claims, 4 Drawing Sheets

(51) Int. Cl.
*E05D 11/00* (2006.01)
*E05F 1/10* (2006.01)
*E05D 7/08* (2006.01)
*H02B 1/38* (2006.01)

(52) U.S. Cl.
CPC .............. *E05F 1/1025* (2013.01); *H02B 1/38* (2013.01); *E05Y 2201/484* (2013.01); *E05Y 2900/606* (2013.01); *Y10T 16/527* (2015.01); *Y10T 16/546* (2015.01); *Y10T 16/5474* (2015.01)

(56) References Cited

U.S. PATENT DOCUMENTS

| | | | | |
|---|---|---|---|---|
| 8,366,220 | B2* | 2/2013 | Oberhauser | E05D 3/16 312/405 |
| 10,538,303 | B2* | 1/2020 | Kijak | E05D 15/48 |
| 10,760,311 | B2* | 9/2020 | Regimbal | G06F 1/1683 |
| 10,760,312 | B2* | 9/2020 | Butler | F25D 29/005 |
| 2005/0188505 | A1* | 9/2005 | Bennett | E05D 3/16 16/366 |
| 2006/0282983 | A1* | 12/2006 | Zetti | E05F 1/1261 16/287 |
| 2010/0176701 | A1* | 7/2010 | Oberhauser | E05D 3/14 312/405 |
| 2011/0049174 | A1* | 3/2011 | Inoue | H01M 50/20 220/827 |
| 2011/0181074 | A1* | 7/2011 | Namura | B60J 5/0487 296/190.01 |
| 2011/0271484 | A1* | 11/2011 | Irwin | E05F 1/1284 16/273 |
| 2012/0227217 | A1* | 9/2012 | Chen | G06F 1/1681 16/366 |
| 2013/0016492 | A1* | 1/2013 | Wang | G06F 1/1681 361/820 |
| 2014/0223694 | A1* | 8/2014 | Hsu | E05D 7/00 16/302 |
| 2014/0331454 | A1* | 11/2014 | Hsu | G06F 1/1681 16/368 |
| 2015/0277506 | A1* | 10/2015 | Cheah | G06F 1/1615 361/679.27 |
| 2017/0177026 | A1* | 6/2017 | Rittenhouse | E05D 11/082 |
| 2017/0218671 | A1* | 8/2017 | Frank | E05D 7/06 |
| 2018/0216379 | A1* | 8/2018 | Spoelstra | E05D 3/14 |
| 2018/0216380 | A1* | 8/2018 | Butler | E05D 7/1077 |
| 2019/0268456 | A1* | 8/2019 | Park | E05D 7/00 |
| 2019/0368247 | A1* | 12/2019 | Carbone | E05D 3/14 |
| 2020/0413557 | A1* | 12/2020 | Zhang | H04M 1/02 |

* cited by examiner

US 11,116,093 B2

WING HINGE FOR A FIELD DEVICE HOUSING AND FIELD DEVICE HOUSING WITH WING HINGE

CROSS-REFERENCE TO RELATED APPLICATION

The present application is related to and claims the priority benefit of German Patent Application No. 10 2018 132 674.2, filed on Dec. 18, 2018, the entire contents of which are incorporated herein by reference.

TECHNICAL FIELD

The present disclosure relates to a wing hinge for a field device housing and to a field device housing having a wing hinge according to the present disclosure.

BACKGROUND

Field device housings are widely used in industry to house electronic components, such as transmitters, in an environmentally protected manner. A user of the field device housing may need access to the interior of the field device housing for various reasons: For example, during the installation of the field device housing at a mount, during the installation of electronic components in the field device housing, during the servicing of the electronic components, and in the event of possible replacement of the electronic components in the field device housing. For this reason, a field device housing normally comprises a housing body having a housing cover which may be opened by the user. It is hereby important that the user is capable of as comfortable an access as possible to the interior of the field device housing in order to execute all work on the field device housing efficiently and optimally. The field device housing should therefore be able to be opened as comfortably as possible and must not interfere with the user during his work. However, in existing field device housings, situations may occur in which the housing cover interferes with the user when the latter performs work on the field device housing. For example, the housing cover may open on its own after a locking screw has been released, for example, if the field device housing is not installed horizontally on a mount. Or, under certain circumstances, the housing cover may close on its own during the maintenance work of the user if the user does not continue to hold the housing cover in an open position. The insertion and/or removal of the housing cover may also be performed only with great effort in known field device housings.

SUMMARY

It is therefore an object of the present disclosure to provide a device which makes it possible to operate a field device housing comfortably.

This object is achieved according to the present disclosure by a wing hinge according to claim 1.

The wing hinge according to the present disclosure includes:

a first wing having a first holding device and a second holding device, wherein the first holding device is suitable to be connected to a housing body of the field device housing and to move the first wing about a first axis of the field device housing;

a second wing having a third holding device and a fourth holding device, wherein the third holding device is suitable to be connected to the second holding device and to move the second wing relative to the first wing about a second axis differing from the first axis, wherein the fourth holding device is suitable to be connected to a housing cover of the field device housing and to move the housing cover of the field device housing relative to the second wing about a third axis differing from the first axis and from the second axis; and a tensioning element which is in contact with the first wing and the second wing and is configured to move the first wing relative to the second wing about the second axis, from a first position into a second position.

Using the wing hinge according to the present disclosure, it is made possible that the housing cover, which is connected to the housing body by the wing hinge, does not open by itself if no further attachment is present between the housing cover and the housing body, because the tensioning element tensions the wing hinge in such a way that the housing cover is held in a closed position. Also, the wing hinge enables that the housing cover does not close by itself if the housing cover is in an open position, because the tensioning element tensions the hinge such that the housing cover is held in an open position. A field device housing with the wing hinge according to the present disclosure can thus be operated very comfortably.

According to one embodiment of the present disclosure, the tensioning element is a spring, preferably a double leg spring.

According to one embodiment of the present disclosure, the first wing and/or the second wing have a first partial element and a second partial element complementary to the first partial element, wherein the first partial element and the second partial element are designed such that the first partial element and the second partial element may be connected to one another by a connecting device so that the first partial element and the second partial element are immovable relative to one another, and wherein the first partial element and the second partial element are designed such that the second holding device of the first wing is suitable for engaging the third holding device of the second wing if the first partial element is connected to the second partial element.

According to one embodiment of the present disclosure, the connecting device comprises a film hinge and a connector, wherein the film hinge integrally connects the first partial element and the second partial element to one another, and wherein the connector is configured to connect the first partial element and the second partial element with one another such that the first partial element and the second partial element are immovable relative to each other.

According to one embodiment of the present disclosure, the first holding device comprises a bolt and a spring element, wherein the first partial element and the second partial element are configured to enclose the bolt and the spring element if the first partial element and the second partial element are connected to one another.

According to one embodiment of the present disclosure, the first wing and/or the second wing have a labeling surface.

According to one embodiment of the present disclosure, the first wing and/or the second wing have a cable mount.

The object according to the present disclosure is also achieved by a field device housing according to claim 8.

The field device housing according to the present disclosure comprises: a housing body with a first receiving device; a housing cover with a second receiving device, wherein the first receiving device is suitable to receive the first holding device or the fourth holding device, and the second receiving device is suitable to receive the fourth holding device or the first holding device, or wherein the first receiving device is suitable to receive the fourth holding device or the first holding device, and the second receiving device is suitable to receive the first holding device or the fourth holding device; and a wing hinge according to any of the preceding claims which is suitable for connecting the housing cover to the housing body.

BRIEF DESCRIPTION OF THE DRAWINGS

The present disclosure is explained in more detail on the basis of the following figures.

DETAILED DESCRIPTION

Figure 1:
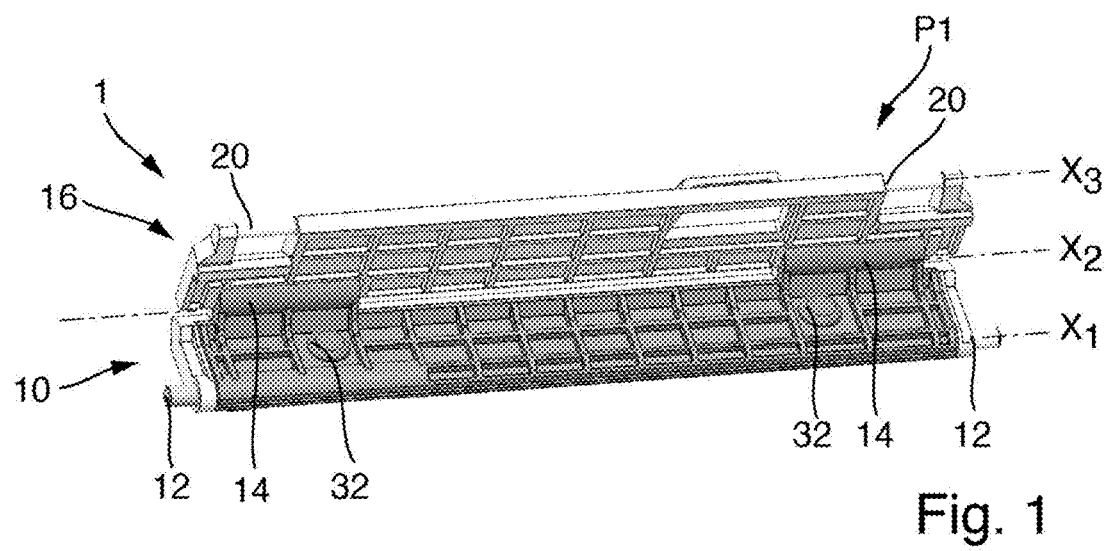
FIG. 1 shows a perspective view of a wing hinge according to the present disclosure.
Figure 2:
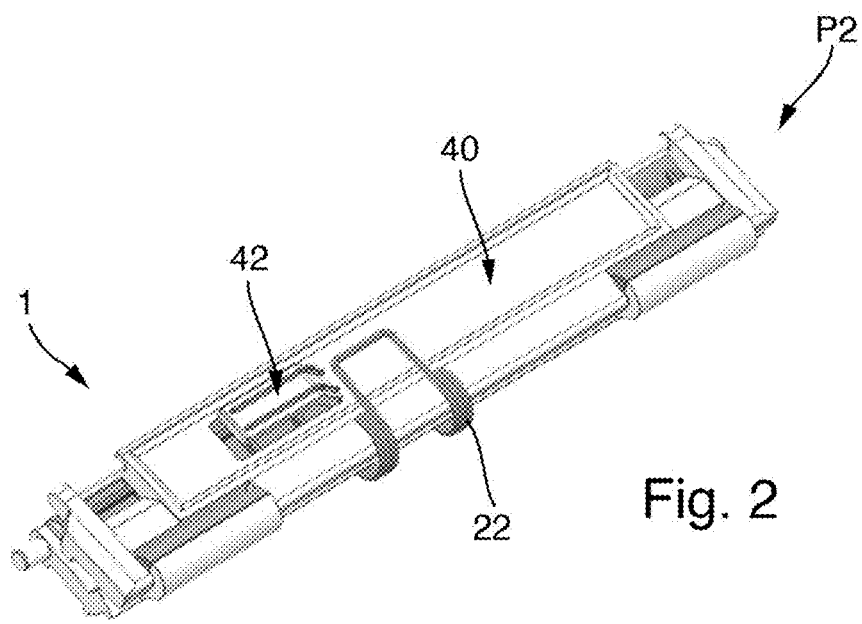
FIG. 2 shows a further perspective view of the wing hinge from FIG. 1.
Figure 3:
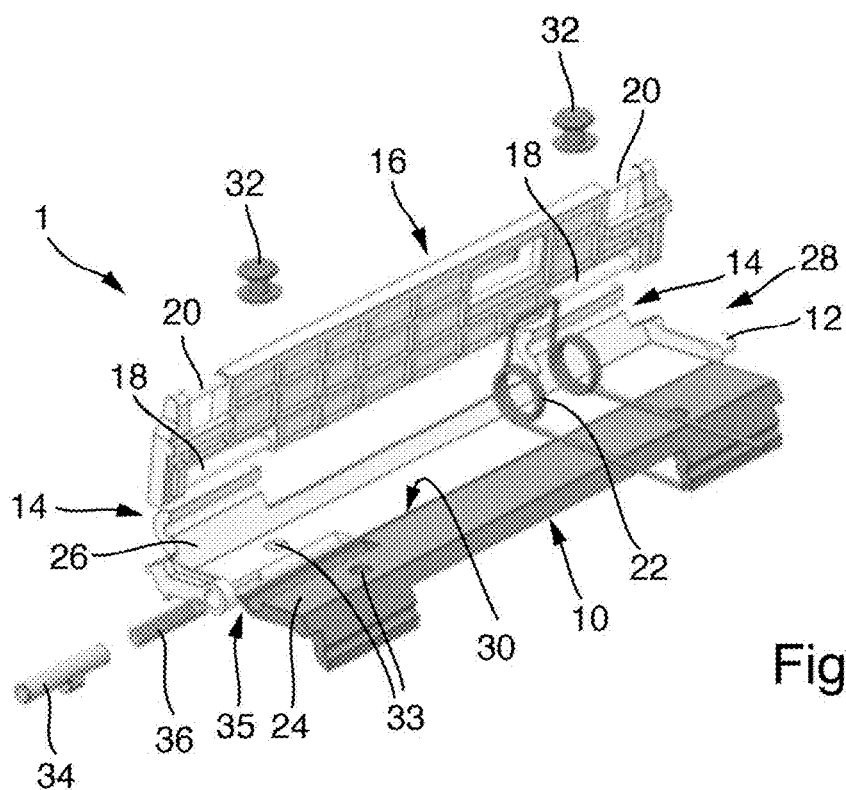
FIG. 3 shows an exploded view of the wing hinge from FIG. 1.

FIGS. 1 through 3 show a wing hinge 1 according to the present disclosure, having a first wing 10, a second wing 16, and a tensioning element 22. The first wing 10 and the second wing 16 are suitable to be fixed to one another and moved relative to one another between a first position P1 (see FIG. 1) and a second position P2 (see FIG. 2). The tensioning element 22 is suitable to be connected to the first wing 10 and the second wing 16 in order to tension the first wing 10 and the second wing 16 relative to one another in such a way that these are moved into the second position P2 (see FIG. 2).

The first wing 10 has a first holding device 12 and a second holding device 14. The first holding device 12 is suitable to be connected to a housing body 4 or to a housing cover 6 of the field device housing 2 (see FIGS. 5 and 6). The housing body 4 has a first receiving device 7 for receiving a holding device of the wing hinge 1. If the first wing 10 is connected to the field device housing 2 via the first holding device 12, the first holding device 12 makes it possible to move the first wing 10 about a first axis X1 (see FIG. 1). The second holding device 14 is suitable to connect the first wing 10 to the second wing 16.

The second wing 16 has a third holding device 18 and a fourth holding device 20 (see FIG. 3). The third holding device 18 is suitable to be connected to the second holding device 14 in order to connect the first wing 10 to the second wing 16. If the second holding device 14 of the first wing 10 is connected to the third holding device 18 of the second wing 16, the first wing 10 may be moved relative to the second wing 16 about a second axis X2 (see FIG. 1). The second axis X2 is preferably different from and parallel to the first axis X1. The second axis X2 passes through the second and third holding devices 14, 18.

Figure 5:
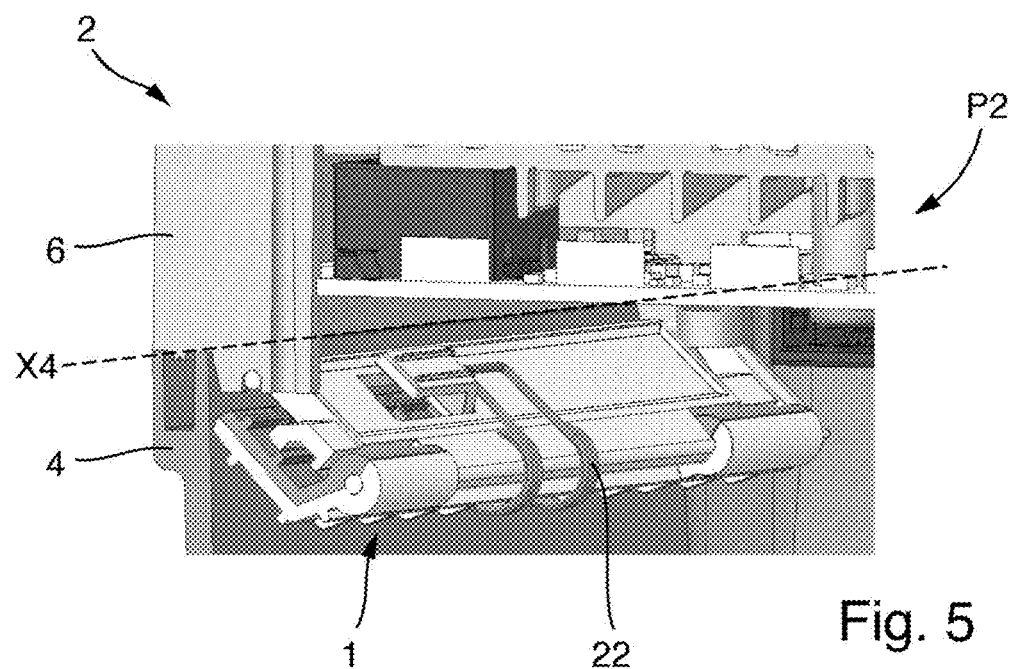
FIG. 5 shows a perspective view of a field device housing with the wing hinge of FIG. 1, wherein the housing cover is in a closed position.
Figure 6:
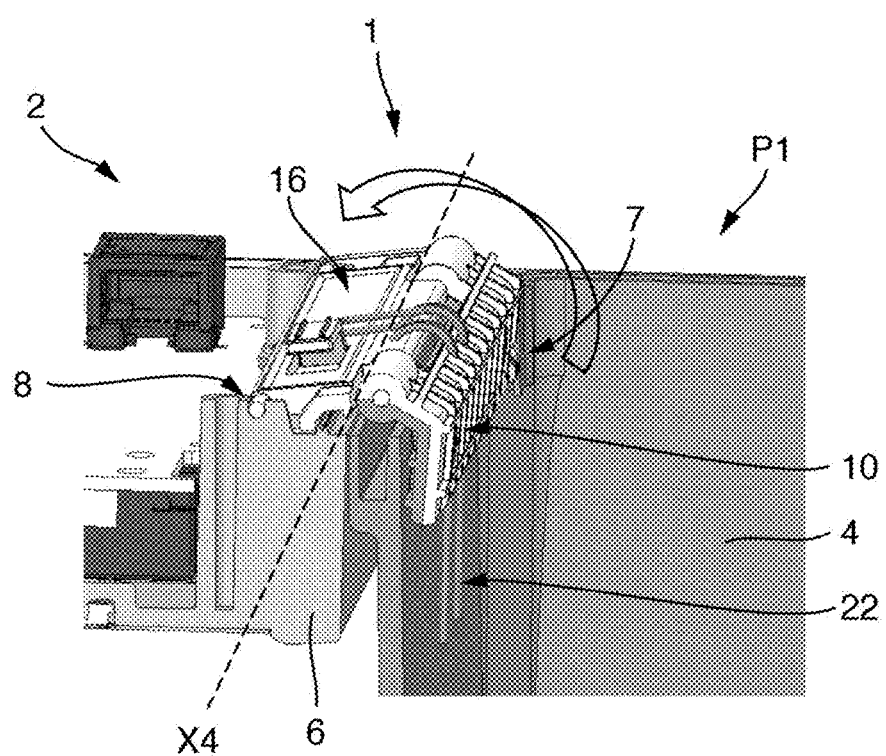
FIG. 6 shows a further perspective view of the field device housing from FIG. 5, wherein the housing cover is in an open position.

The first holding device 20 is suitable to be connected to a housing cover 6 or housing body 4 of the field device housing 2 (see FIGS. 5 and 6). The housing cover 6 has a second receiving device 8 for receiving a holding device of the wing hinge 1. If the fourth holding device 20 is connected to the field device housing 2, the second wing 16 may be moved about a third axis X3 (see FIG. 1). The second wing 16 can thus be moved relative to the field device housing 2. The third axis X3 is preferably different from and parallel to the first axis X1, and different from and parallel to the second axis X2.

The tensioning element 22 is a spring, for example. In the exemplary embodiment shown in FIGS. 2, 3, 5 and 6, the tensioning element 22 is a double leg spring. Of course, the tensioning element 22 may also be designed as another type of spring. In an embodiment that is not shown, the tensioning element 22 is designed as an elastic element, for example, as a sheet metal strip.

FIG. 3 shows an embodiment of the wing hinge 1 in which the first wing 10 comprises a first partial element 24 and a second partial element 26 complementary to the first partial element 24. The first partial element 24 and the second partial element 26 are designed such that the first partial element 24 and the second partial element 26 may be connected to one another by a connecting device 28, so that the first partial element 24 and the second partial element 26 are immovable relative to one another.

The two-piece embodiment of the first wing 10 by means of the first and second partial elements 24, 26 enables the simple introduction of a bolt 34 and spring element 36 into the first wing 10, which will be described in more detail later.

Likewise, the two-piece embodiment of the first wing 10 by means of the first and second partial elements 24, 26 enables the simple anchoring of the tensioning element 22 in the first wing 10 (not shown). In this instance, one or both of the partial elements 24, 26 has, for example, a recess 35 which is designed such that the tensioning element 22 may be at least partially accommodated therein (see FIG. 3).

The first partial element 24 and the second partial element 26 are advantageously designed such that the second holding device 14 of the first wing 10 is suitable for encompassing the third holding device 18 of the second wing 16 if the first partial element 24 is connected to the second partial element 26 (see FIGS. 1 and 3). This enables a simple and secure connection of the first wing 10 to the second wing 16.

It is also possible to accordingly design the second wing 16 in two-parts, as described above with respect to the first wing 10 (not shown). As already stated above, this enables a simple anchoring of the tensioning element 22 in the second wing 16, for example, between the two parts of the second wing 16. In this instance, it is also possible to configure the third holding device 18 of the second wing 16 such that the second holding device 14 of the first wing 10 may be encompassed by the third holding device 18 if the first partial element 24 is connected to the second partial element 26 (not shown).

In the embodiment shown in FIG. 3, the connecting device 28 is designed such that it comprises a film hinge 30 and a connector 32. The film hinge 30 integrally connects the first partial element 24 and the second partial element 26 with one another. The connector 32 is configured to connect the first partial element 24 and the second partial element 26 to one another such that the first partial element 24 and the second partial element 26 are immovable relative to one another. The connector 32 is, for example, a rivet or screw with or without a nut. In this instance, the first partial element 24 and the second partial element 26 have an opening 33 in order to receive the rivets, for example. An advantage of such a connecting device 28 is that the first wing 10, together with the film hinge 30, may be produced very simply and precisely via injection molding.

It is also possible to use a chemical binder, for example, adhesive, as the connector 32. Alternatively, the first partial element 24 and the second partial element 26 may also be connected via a welding method, for example, ultrasonic welding.

In an embodiment which is not shown, the connecting device 28 is designed as a snap connection. The first partial element 24 then has a snap hook, and the second partial element 26 has a receiving opening (not shown) complementary to the snap hook.

Figure 4:
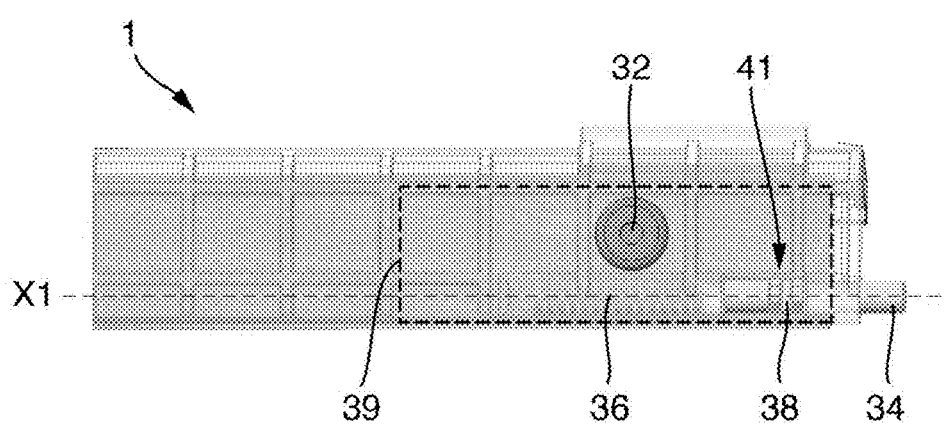
FIG. 4 shows a detailed view of the bolt of the wing hinge from FIG. 1.

FIG. 4 shows a detail view of the aforementioned bolt 34 and the spring element 36, which are part of the first holding device 12. The first wing 10 has the recess 35 which is configured to receive the bolt 34 and the spring element 36. The first partial element 24 and the second partial element 26 are configured to enclose the bolt 34 and the spring element 36 if the first partial element 24 and the second partial element 26 are connected to one another. The two-part design of the first wing 10 thus enables the insertion of the bolt 34 and the spring element 36 into the recess 35.

The first holding device 12 is designed such that the bolt 34 can move from a first position in which the bolt 34 projects out of the first wing 10 (see FIG. 4) into a second position in which the bolt 34 does not project out of the first wing 10 (not shown). The spring element 36 is suitable to move the bolt 34 to the first position. The bolt 34 can preferably be moved along the first axis X1. Ideally, the housing body 4 or the housing cover 6 has a draft angle, i.e. a ramp-shaped section leading to the first receiving device 7, which enables the bolt 34 to move into its second position if the first holding device 12 is inserted into the first receiving device 7. If the first holding device 12 is then in the provided position above the first receiving device 7, the bolt 34 snaps into the first receiving device 7 via the spring force of the spring element 36 which presses the bolt 34 into the first position. Via the spring element 36, it is possible to comfortably insert the wing hinge 1 into the housing body 4 or the housing cover 6 of the field device housing 2.

The bolt 34 has a nose 38 which enables the bolt 34 to be grasped in order to move said bolt 34. The first wing 10 has a window 41 through which the nose 38 protrudes if the first partial element 24 and the second partial element 26 are connected. Thus, after inserting the hinge 1 into the field device housing 2, it is possible for a user to grasp the bolt 34 with a tool or by hand and move it into its second position in order to remove the hinge from the field device housing 2.

Of course, the bolt 34 described above may also be attached to other holding devices of the wing hinge, if this is desired. The respective wings are then to be configured as described above in this context.

FIG. 2 shows the first wing 10 with a labeling surface 40. The labeling surface 40 allows the wing hinge 1 to be provided with information relevant to the user. For example, the labeling surface 40 may include information about the contents of the field device housing 2. Of course, the second wing 16 may also have a labeling surface.

FIG. 2 shows the second wing 16 with a cable retainer 42. The cable retainer 42 makes it possible to fasten cable strands to the wing hinge 1, which cable strands extend from the housing cover 6 to the housing body 4, for example. Of course, the first wing 10 may also have a cable bracket.

FIGS. 5 and 6 show the wing hinge 1 in its installed state in the field device housing 2. The first holding device 12 of the first wing 10 is connected to the first receiving device 7 of the housing body 4. The fourth holding device 20 of the second wing 16 is connected to the second receiving device 8 of the housing cover 6. The tensioning element 22 is connected to the first wing 10 and the second wing 16, and acts with a tensioning force on the first wing 10 and the second wing 16 in order to move these into the second position P2, in which the two wings 10, 16 lie closely against one another (see FIG. 5).

In FIG. 5, the housing cover 6 is in a closed position and rests on the housing body 4. In this instance, the first and second wings 10, 16 are in their second position P2. The housing cover 6 is thus held in its closed position by the tensioning element 22.

If the housing cover 6 is now opened by a user of the field device housing 2, this moves the first and second wings 10, 16 out from the second position P2 to the first position 1. The tensioning element 22 counteracts this movement with a predetermined tensioning force. The tensioning force is ideally chosen such that the own weight of the housing cover 6 is not sufficient to move the first and second wings 10, 16 out of the second position 2.

Thus, the field device housing 2 cannot open without an additional force applied by the user. The wing hinge 1 thus prevents the housing cover 6 from unintentionally opening due to its own weight if the housing cover 6 is in its closed position. The user is thus not disturbed by the housing cover 6 if, for example, he has removed a safety lock or a safety screw for securely locking the field device housing (not shown).

Figure 7:
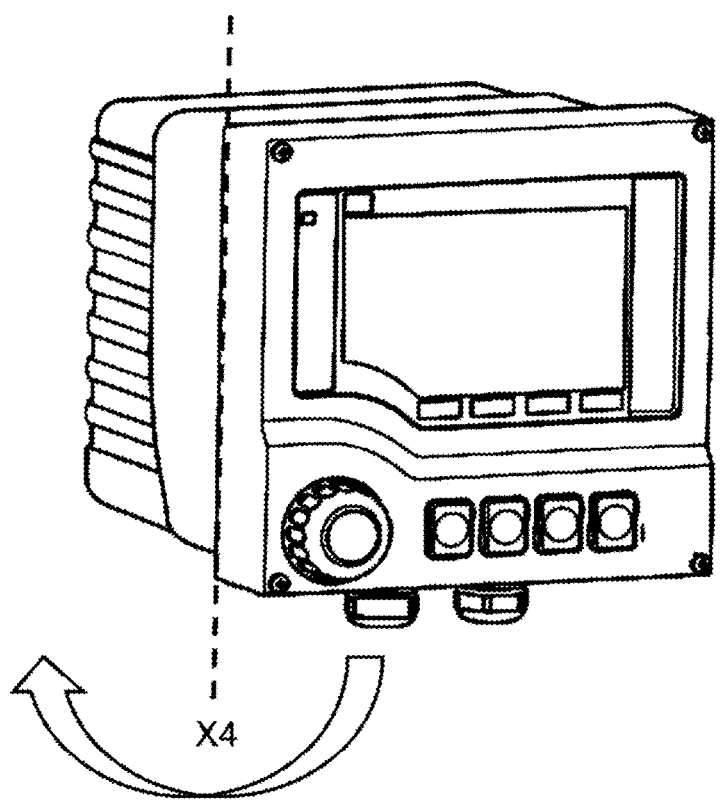
FIG. 7 shows an exemplary view of a field device housing.

If the user applies an additional force to the wing hinge 1 so that the first and second wings 10, 16 are moved into their first position P1, the field device housing 2 opens. Upon opening the field device housing 2, the second receiving device 8 of the housing cover 6 is moved away relative to the first receiving device 7 of the housing body 4 (see FIGS. 5 and 6). In other words, the housing cover 6 is moved from its closed position into an open position about a fourth axis X4, which is represented by the arrow in FIG. 6. FIG. 7 illustrates the position of the fourth axis X4 about which the housing cover 6 is pivoted if the field device housing 2 is opened.

The first receiving device 7 of the housing body 4 and the second receiving device 8 of the housing cover 6 are arranged in such a way that, if the housing cover 6 is in the open position, the tensioning element 22 holds the housing cover 6 in the open position (see FIG. 6). Ideally, the tensioning force of the tensioning element 22 is also sufficient in this situation in order to hold the housing cover 6 in its open position.

The wing hinge 1 thus prevents the housing cover 6 from unintentionally closing due to its own weight if the housing cover 6 is in its open position.

In an alternative embodiment, the first wing 10 includes a cover 39 (see dashed line in FIG. 4) to reveal the bolt 34 and spring element 36. The cover 39 is suitable to be connected to the wing 10 by the connector 32. The cover 39 optionally has undercuts so that the cover 39 may be simply pre-assembled at the wing. The cover 39 enables the bolt 34 as well as the spring element 36 to be inserted into the wing 10. This embodiment thus allows all wings to be designed in one piece. This embodiment may of course also be executed at the second wing 16.

If the first wing 10 and the second wing 16 are respectively configured in one piece, the second holding device 14 and the third holding device 18 are preferably configured as a complementary hinge connection (not shown). This hinge connection comprises a bolt which, for example, is embodied by the second holding device 14, and a bushing which, for example, is embodied by the third holding device 16 and is designed to receive the bolt. In this embodiment, the holding devices are designed in such a way that these may only be connected in a predetermined position relative to one another.

This predetermined position is, for example, such that both holding devices may be connected relative to one another only at an angle of 180°, provided that the second holding device 14 and the third holding device 16 are arranged along the second axis X2.

In this embodiment, for the assembly of the first and second wings, this means that in a first step these are positioned with respect to one another such that the second holding device 14 and the third holding device 18 are arranged on the second axis X2. The two wings are hereby arranged at an angle of 180° relative to one another. The two holding devices are then displaced along the second axis X2 so that the holding devices engage. Finally, the wings are moved relative to each other about the second axis X2 so that the wings have an angle of less than 180° relative to one another, which locks the holding devices.

In the predetermined usage, the predetermined position of 180° is preferably not reached. What is meant here by predetermined usage is the opening and closing of the field device housing 2. A closed field device housing 2 is shown in FIG. 5. An open field device housing 2 is shown in FIG. 6.

The invention claimed is:

1. A wing hinge for a field device housing, the hinge comprising:
   a first wing including a first holding device and a second holding device, the first holding device configured to connect to a housing body of the field device housing and to enable movement of the first wing about a first axis of the field device housing;
   a second wing including a third holding device and a fourth holding device, the third holding device configured to connect to the second holding device and to enable movement of the second wing relative to the first wing about a second axis different from the first axis,
   wherein the fourth holding device is configured to be connectable to a housing cover of the field device housing and to enable movement of the housing cover of the field device housing relative to the second wing about a third axis different from the first axis and from the second axis; and
   a tensioning element in contact with the first wing and the second wing and configured to move the first wing relative to the second wing about the second axis from a first position into a second position,
   wherein the first wing or the second wing includes a first partial element and a second partial element complementary to the first partial element,
   wherein the first partial element and the second partial element are configured such that the first partial element and the second partial element are connectable to one another by a connecting device, such that the first partial element and the second partial element are immovable relative to one another,
   wherein the first partial element and the second partial element are configured such that the second holding device of the first wing can engage the third holding device of the second wing when the first partial element is connected to the second partial element.

2. The hinge of claim 1, wherein the tensioning element is a spring.

3. The hinge of claim 1, wherein the connecting device includes a film hinge and a connector, the film hinge integrally connecting the first partial element and the second partial element to one another, wherein the connector is configured to connect the first partial element and the second partial element with one another such that the first partial element and the second partial element are immovable relative to each other.

4. The hinge of claim 1, wherein the first holding device includes a bolt and a spring element, wherein the first partial element and the second partial element are configured to enclose the bolt and the spring element when the first partial element and the second partial element are connected to one another.

5. The hinge of claim 1, wherein the first wing and/or the second wing includes a labeling surface.

6. The hinge of claim 1, wherein the first wing or the second wing include a cable mount.

7. A field device housing, comprising:
   a housing body including a first receiving device;
   a housing cover including a second receiving device; and
   a wing hinge according to claim 1 arranged to connect the housing cover to the housing body,
   wherein the first receiving device is configured to receive the first holding device or the fourth holding device, and the second receiving device is configured to receive the fourth holding device or the first holding device.

* * * * *